(12) United States Patent
Hanson et al.

(10) Patent No.: US 7,123,529 B1
(45) Date of Patent: Oct. 17, 2006

(54) SENSE AMPLIFIER INCLUDING MULTIPLE CONDUCTION STATE FIELD EFFECT TRANSISTOR

(75) Inventors: David R. Hanson, Brewster, NY (US); David M. Onsongo, Newburgh, NY (US); Dureseti Chidambarrao, Weston, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/160,054

(22) Filed: Jun. 7, 2005

(51) Int. Cl.
*G11C 7/00* (2006.01)
(52) U.S. Cl. .................. 365/205; 365/208; 365/218
(58) Field of Classification Search ............... 365/205, 365/208, 218, 201, 226; 327/55, 51–53
See application file for complete search history.

(56) References Cited

U.S. PATENT DOCUMENTS

| | | | |
|---|---|---|---|
| 4,551,641 A | 11/1985 | Pelley, III | |
| 5,042,011 A | 8/1991 | Casper et al. | |
| 5,627,789 A * | 5/1997 | Kalb, Jr. | 365/205 |
| 5,741,738 A | 4/1998 | Mandelman et al. | |
| 6,205,066 B1 * | 3/2001 | Shirley | 365/200 |
| 6,449,202 B1 | 9/2002 | Akatsu et al. | |
| 6,903,981 B1 * | 6/2005 | Futatsuyama et al. | 365/185.33 |

\* cited by examiner

*Primary Examiner*—Gene N. Auduong
(74) *Attorney, Agent, or Firm*—Daryl K. Neff; H. Daniel Schnurmann (57) ABSTRACT

An integrated circuit is provided which includes a sensing circuit. In the sensing circuit, a pair of conductors including a first conductor and a second conductor are adapted to conduct a first differential signal having a small voltage difference and a second differential signal having a rail-to-rail voltage difference. A sense amplifier is coupled to the pair of conductors, the sense amplifier being operable to amplify the first differential signal into the second differential signal. The sensing circuit further includes a multiple conduction state field effect transistor or "multi-state FET" which has a source, a drain, and a gate operable to control conduction between the source and the drain. The multi-state FET has a first threshold voltage and a second threshold voltage which is effective at the same time as the first threshold voltage such that the multi-state FET is operable by the gate voltage to switch between an essentially non-conductive state, a first conductive state when a gate-source voltage applied between a gate and a source of the FET is between the first threshold voltage and the second threshold voltage, and a second conductive state when the gate voltage exceeds the second threshold voltage. The multi-state FET is used to perform an operation included in amplifying the first signal into the second signal by the sense amplifier.

20 Claims, 5 Drawing Sheets

SENSE AMPLIFIER INCLUDING MULTIPLE CONDUCTION STATE FIELD EFFECT TRANSISTOR

BACKGROUND OF THE INVENTION

The present invention relates to integrated circuits which include sense amplifiers such as used to amplify a small voltage swing signal into a rail-to-rail voltage swing signal.

Frequently, small voltage swing signals need to be amplified into rail-to-rail voltage swing signals when converting analog signals into digital signals as well as when restoring a weak signal used in a digital system to full digital logic levels. A particular type of circuit used to perform such function in a dynamic random access memory ("DRAM") is known as a sense amplifier. Sense amplifiers are used in both dedicated stand-alone DRAM chips, as well as chips which include an embedded DRAM as a functional element of the chip. Sense amplifiers typically operate by converting a signal representing a charge stored on a storage capacitor of a memory into a rail-to-rail voltage signal.

Figure 1:
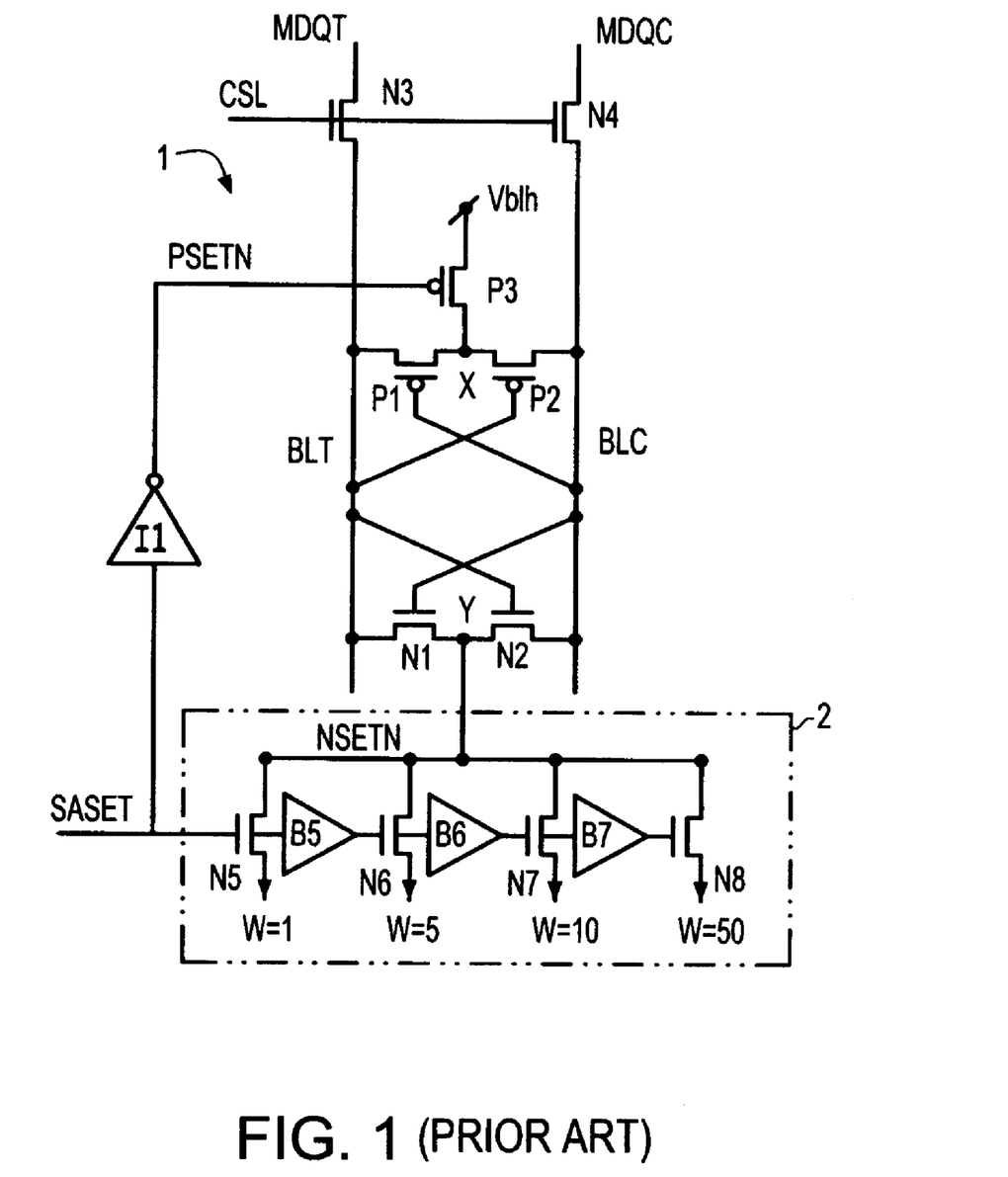
FIG. 1 is a circuit-level schematic diagram illustrating a sensing circuit according to the prior art.

FIG. 1 is a circuit-level diagram illustrating a sense amplifier 1 according to the prior art, being one such as used to read out a data bit signal from a memory cell of a DRAM or to write a data bit signal to such memory cell. The particular type of sense amplifier depicted therein is one which amplifies a small voltage swing signal between a first bitline ("BLT") and a second bitline ("BLC") into a rail-to-rail voltage swing signal between the first and second bitlines. The first bitline BLT carries the signal of interest, such as a signal obtained from a cell of a memory array. The second bitline BLC typically provides a reference signal to the sense amplifier for improved noise immunity. During amplification, the signal level on one of the two bitlines is driven to a predetermined bitline high voltage rail level ("Vblh") and the signal level on the other one of the two bitlines is driven to a predetermined low voltage rail level such as ground.

Once the signals on the bitlines BLT and BLC have been driven to rail-to-rail levels, they can then be transferred onto "master data" lines MDQT and MDQC when a column select signal (CSL) selects them for reading out of the DRAM. Alternatively, or in addition thereto, the signals on the bitlines BLT, BLC are used to rewrite the amplified rail-to-rail logic level signal to the currently accessed memory cell.

The sense amplifier includes two pairs of cross-coupled devices which operate to drive the signals on the bitlines BLT and BLC to their respective high and low voltage rail levels. A pair of cross-coupled p-type field effect transistors ("PFETs") P1 and P2 having sources coupled to an internal node X and drains coupled to the bitlines BLT and BLC, respectively, are used to drive one of the bitlines to the high voltage rail level. A pair of cross-coupled n-type field effect transistors ("NFETs") N1 and N2 having sources coupled to an internal node Y and drains coupled to the bitlines BLT and BLC, respectively, are used to drive the other one of the bitlines to the low voltage rail level. These pairs of cross-coupled PFETs and NFETs require activation at carefully controlled timings in order to avoid amplifying indeterminate signals and the possibility of erroneously inverting the output states of BLT and BLC during amplification. The cross-coupled PFETs P1 and P2 are operated by a device P3 which is connected as a pull-up device to a voltage supply and is operated by a timed signal PSETN. On the other hand, the NFETs are operated by a pull-down network 2 which is timed by a signal SASET. The illustrated pull-down network is referred to as a "sequential pull-down circuit", having a series of cascaded pairs of transistors and buffers which operate to discharge the voltage at node Y slowly at first, and then accelerate the discharging action as time elapses. In the pull-down network 2, a transistor N5 turns on, then one buffer delay later, a transistor N6 turns on. A buffer delay after transistor N6 turns on, the transistor N7 turns on, finally followed by transistor N8 turning a buffer delay after that. The transistors N5, N6, N7 and N8 have channel widths which progressively increase from the first transistor N5 in the series to the last, in order for these transistors to sink a progressively increasing amount of current as the pull-down network 2 turns on. For example, transistor N5 has width=1, while transistor N6 has width=5, N7 has width=10, and N8 has width=50. The amount of current conducted by each transistor is proportional to its width. When all of the buffer delays have elapsed, all transistors N5 through N8 are turned on, such that the final pull-down current is about 70 times the initial pull-down current when only transistor N5 is turned on.

In an example of operation, prior to a read or write operation, the bitlines BLT and BLC are precharged to a predetermined voltage level referred to as "Vbleq", which is typically one of ground, Vblh, or an intermediate level between ground and Vblh such as ½ Vblh. The master data lines MDQT and MDQC are precharged to a high potential such as Vblh. When a read operation begins, a small voltage difference signal arises between the signal levels on bitlines BLT and BLC. The timing signal SASET is activated, which causes the PSETN signal to be generated by inverter I1 for operating the pull-up transistor P3. SASET also causes the pull-down network 2 to generate the NSETN drive current to ground to provide the pull-down function.

In such example, it will be assumed that initially BLT is at a higher potential than BLC. When SASET is activated to transition from low logic level to the high logic level, transistor N5 of the pull-down network is activated, causing transistor N2 to conduct and slowly pull down the voltage on BLC to ground. It is important that the pull-down network not discharge the node Y too quickly, otherwise, the signal on the bitline BLT could be pulled low, possibly corrupting the output signal of the data bit sensed by the sense amplifier 1.

The activation of SASET also turns on the pull-up transistor P3. As BLC is slowly pulled towards ground, transistor P1 begins to slowly turn on, causing BLT to be driven towards Vblh. The speed at which BLC is driven lower towards ground is related to the speed at which transistor P1 turns on to drive BLT high. this speed, in turn, is controlled by the amount of current being sunk by the pull-down circuit 2. By virtue of the staged nature of the pull-down circuit, the speed is increased as time elapses so that the value of the data bit is not accidentally flipped when amplification is finished. Once BLT and BLC have stabilized to present a rail-to-rail signal, a column select line CSL can be raised to transfer the signals on BLT and BLC to the master data lines MDQT and MDQC.

A write operation is performed in a manner similar to that of the read operation. At the beginning of the write operation, a data bit signal is transferred from the MDQT and MDQC data lines onto the bitlines BLT and BLC. The SASET signal is asserted and the sense amplifier including the pull-down circuit 2 operate in the same manner as described above to amplify the signals on BLT and BLC to a rail-to-rail signal.

One problem with the above-described circuitry is the large area required by the sequential pull-down circuit 2. Its multiple buffers and multiple transistors of increasing size occupy a large part of the area of a DRAM or embedded DRAM macro. Since many hundreds or thousands of sense amplifiers are needed to support a DRAM array of even modest size, e.g., up to several Mbits, its share of the total area of the DRAM is significant.

SUMMARY OF THE INVENTION

According to an aspect of the invention, an integrated circuit is provided which includes a circuit for amplifying a small voltage swing signal into a second signal having a rail-to-rail voltage swing. Such circuit includes a conductor adapted to conduct a first signal having a small voltage swing and a second signal having a rail-to-rail voltage swing; and an amplifier coupled to the conductor which is operable to amplify the first differential signal into the second differential signal. The amplifier include a multiple conduction state field effect transistor ("multi-state FET") having a source, a drain, and a gate operable to control conduction between the source and the drain. The multi-state FET has a first threshold voltage and a second threshold voltage effective at the same time as the first threshold voltage, and the gate is operable to control the multi-state FET between multiple operational states which include a) an essentially nonconductive state when a gate-source voltage applied between the gate and the source does not exceed the first threshold voltage and does not exceed the second threshold voltage and in which a source-drain current between the source and the drain is at most negligible; b) a first conductive state when the gate-source voltage exceeds the first threshold voltage and does not exceed the second threshold voltage, such that the source-drain current has a first operating value; and c) a second conductive state when the gate-source voltage exceeds the first threshold voltage and the second threshold voltage such that the source-drain current has a second operating value at least about ten times larger than the first operating current value; wherein the multi-state FET is operable by the gate-source voltage to switch between the essentially nonconductive state, the first conductive state and the second conductive state to perform an operation included in amplifying the first signal into the second signal by the amplifier.

According to another aspect of the invention, an integrated circuit is provided which includes a sensing circuit. In the sensing circuit, a pair of conductors including a first conductor and a second conductor are adapted to conduct a first differential signal having a small voltage difference and a second differential signal having a rail-to-rail voltage difference. A sense amplifier is coupled to the pair of conductors, the sense amplifier being operable to amplify the first differential signal into the second differential signal. The sensing circuit further includes a multiple conduction state field effect transistor or "multi-state FET" which has a source, a drain, and a gate operable to control conduction between the source and the drain. The multi-state FET has a first threshold voltage and a second threshold voltage which is effective at the same time as the first threshold voltage, such that the gate is operable to control the multi-state FET between a) an essentially nonconductive state when a gate voltage applied to the gate does not exceed the first threshold voltage and does not exceed the second threshold voltage and in which a source-drain current between the source and the drain is at most negligible; b) a first conductive state when the gate voltage exceeds the first threshold voltage and does not exceed the second threshold voltage such that the source-drain current has a first operating current value; and c) a second conductive state when gate voltage exceeds the first threshold voltage and the second threshold voltage such that the source-drain current has a second operating current value. The second operating current value is at least about ten times larger than the first operating current value. In such way, the multi-state FET is operable by the gate voltage to switch between the essentially nonconductive state, the first conductive state and the second conductive state to perform an operation included in amplifying the first signal into the second signal by the sense amplifier.

DETAILED DESCRIPTION

According to the embodiments of the invention described herein, a sense amplifier is provided which occupies reduced area due to replacement of the above-described sequential pull-down circuit with an alternative circuit which occupies smaller area. In particular embodiments, the alternative circuit is a single FET having multiple conduction states such that the FET turns on in stages and progressively conducts more current when amplifying a small voltage swing signal into a rail-to-rail voltage signal. Since the single FET is one transistor rather than a circuit having multiple transistors and buffers, it can be fabricated in a way that occupies less area than the above-described pull-down circuit 2 (FIG. 1).

Figure 2:
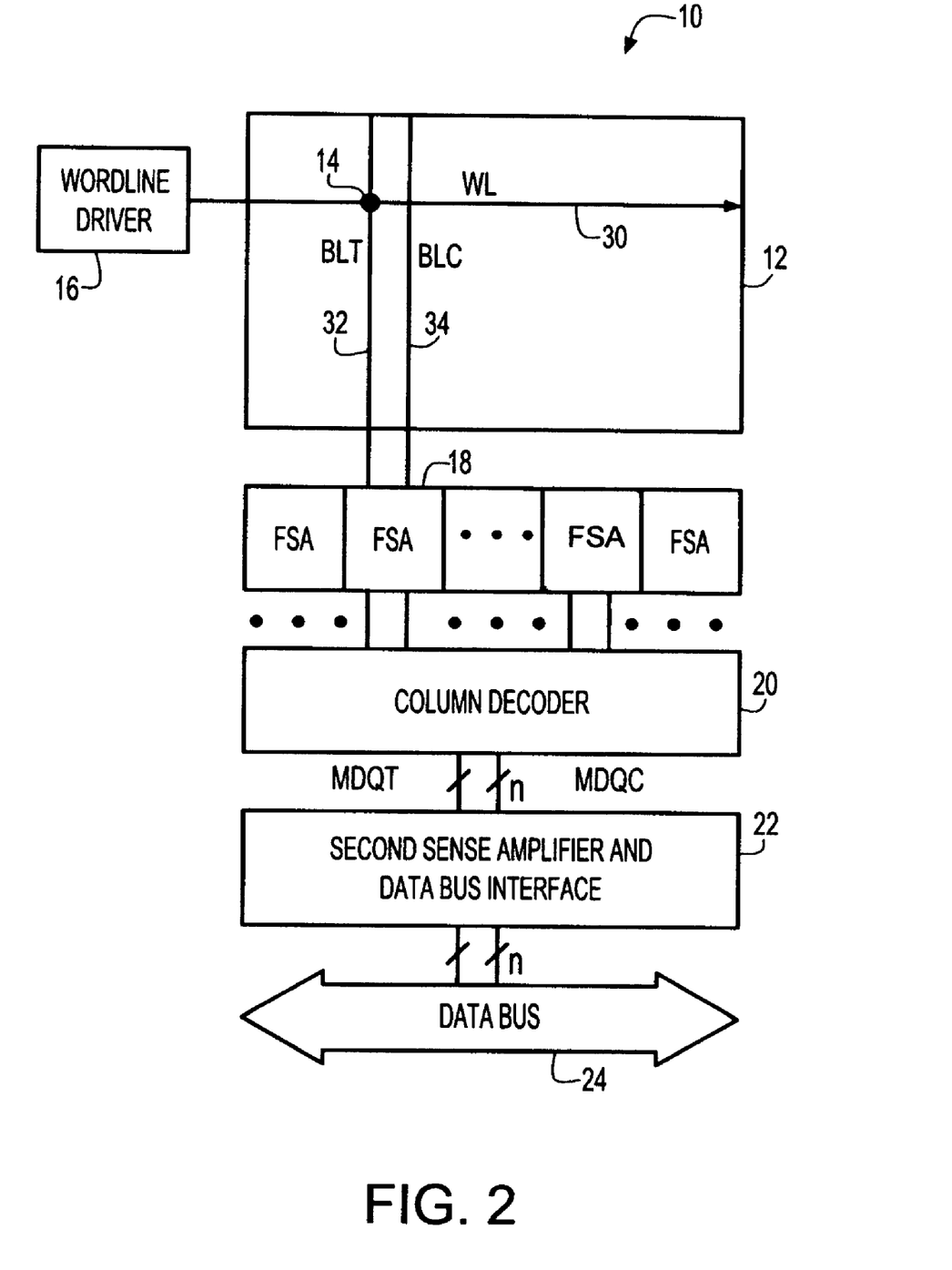
FIG. 2 is a block and schematic diagram illustrating the structure and operation of a dynamic random access memory, within which a sensing circuit according to an embodiment of the invention is provided.

Turning to FIG. 2, a DRAM and a sense amplifier used within it will now be described, these being helpful to understanding the embodiments of the invention. FIG. 2 is a diagram illustrating elements of a DRAM 10, which can either be a stand-alone DRAM chip or an embedded DRAM macro of a chip having some other function, as a processor, for example. As shown in FIG. 2, the DRAM 10 includes an array 12 of memory cells 14. Each memory cell has a capacitor (not shown) which stores a greater or lesser charge depending on the value of the data bit stored in the memory cell. For example, when the stored data bit is a "0", a smaller charge is stored on the capacitor than when the data bit is a "1". Reading and writing to the memory cell is performed using a wordline driver 16 and a first sense amplifier ("FSA") 18, the latter device being one of many FSAs provided in the DRAM 10. In addition to the FSAs 18, a column decoder unit (CDEC) 20, MDQT and MDQC master data lines, as well as a second sense amplifier (SSA)/data bus interface 22, assist in reading out the data from the array 12 onto a data bus 24. Similarly, the SSA/data bus interface 22, CDEC 20 and the FSAs 18 provide a path for writing data bits from the data bus 24 into memory cells of the array 12.

In an example of a read operation, a data bit stored in a memory cell 14 is accessed when a wordline driver activates a selected wordline 30 connected to the memory cell. This not only causes the charge stored in the selected memory cell(s) to begin to flow on a bitline ("BLT") 32 towards the FSAs, but also causes the charges stored in all memory cells connected to that wordline to begin to flow on respective bitlines towards FSAs coupled to the respective bitlines. Because the size and value of the capacitor of each memory cell are necessarily small, and the length of the bitline is relatively large, only a small voltage swing signal develops at the FSA 18. The small voltage swing signal typically swings about 100 mV or less, a voltage swing of about 30 mV to 50 mV being common for some DRAMs.

As one way of improving immunity to noise, the FSA also receives a signal from a reference bitline which is not connected to any memory cell that is accessed by the activated wordline. This reference bitline is denoted "BLC" 34 in FIG. 2. The reference bitline is situated close to the bitline that is currently accessed so that it is subject to the same noise conditions as the accessed bitline. For example, in many DRAMs, the reference bitline is physically adjacent to the accessed bitline. The FSA amplifies a small voltage swing differential signal arising between the voltages BLT and BLC into a rail-to-rail voltage swing signal.

Figure 3:
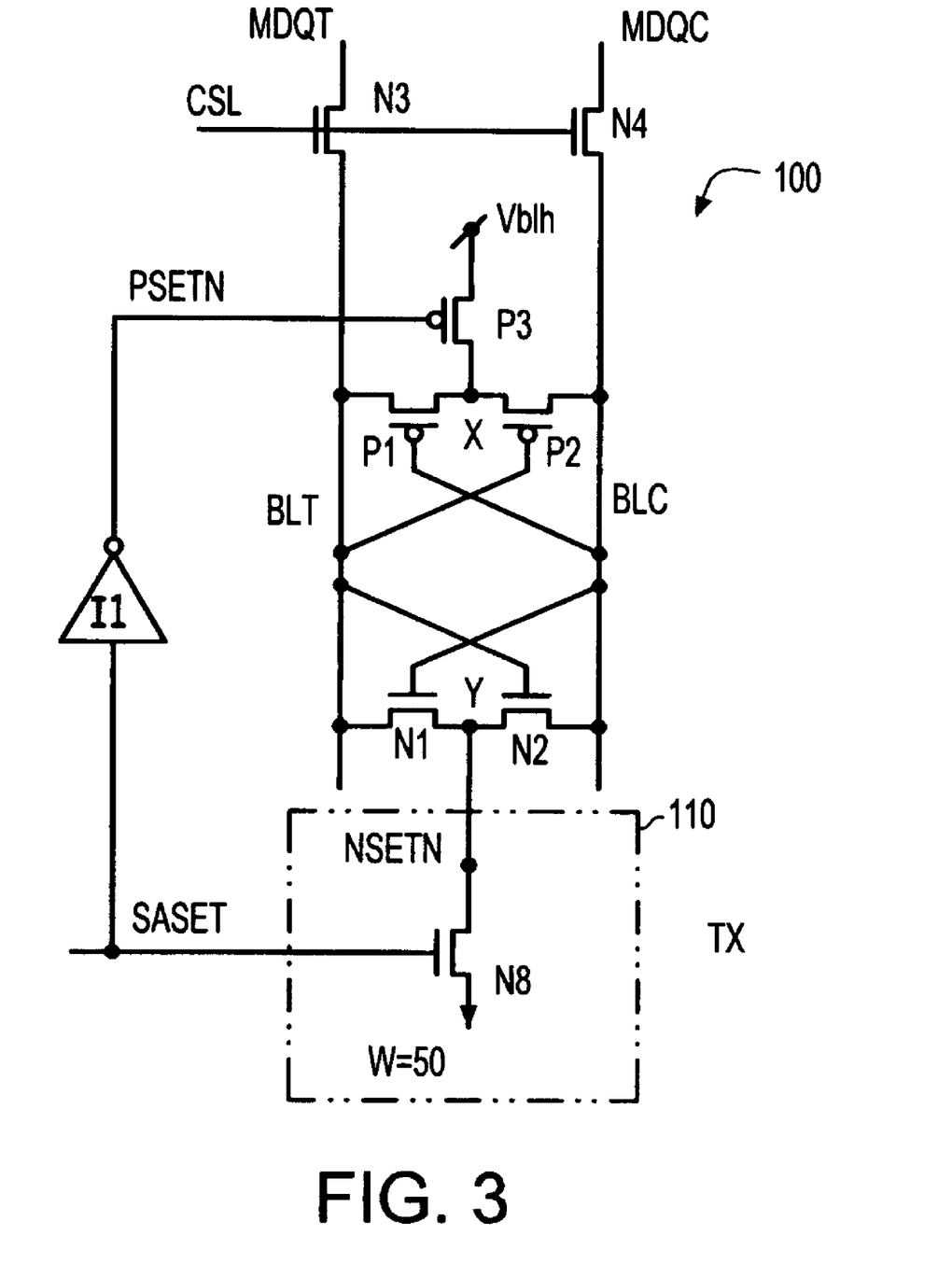
FIG. 3 is a circuit-level schematic diagram illustrating a sensing circuit according to an embodiment of the invention.

A circuit-level diagram of a sense amplifier 100 according to an embodiment of the invention is illustrated in FIG. 3. As briefly discussed above, the sense amplifier 100 includes as a pull-down circuit 110 a single FET pull-down device N8 which has multiple conduction states. In a preferred embodiment, the pull-down device N8 is an n-type FET which has a width value of 50, which is about equal to the width of the largest FET in the pull-down circuit 2 according to the prior art. Thus, the single FET N8 in FIG. 3 replaces the pull-down circuit 2 (FIG. 1) of the sense amplifier discussed above according to the prior art. Otherwise, the circuit elements of the sense amplifier 100 shown in FIG. 3 are the same as those of FIG. 1 described above. However, operation of the sense amplifier 100 and the SASET signal which times the sense amplifier 100 are different, as will be described below.

The multiple-conduction state FET ("MCSFET") is similar to known FETs in that it has an essentially nonconductive state when a gate to source voltage applied to the MCSFET does not exceed a first threshold voltage. The MCSFET also has a fully conductive state when the gate to source voltage is above a second threshold voltage or "final threshold voltage" that enables the MCSFET to be fully conductive. The fully conductive state is defined as a level in which an inversion layer forms in the channel region as a result of the voltage applied between the gate and the source of the MCSFET.

However, unlike ordinary FETs, the first threshold voltage and the final threshold voltage have different values. When the gate to source voltage is between the first threshold voltage and the final threshold voltage the MCSFET has another conductive state in which the MCSFET is turned on, but conducts a relatively low amount of current. At that time the MCSFET conducts a current having a magnitude which is ten or more times smaller than the current conducted when the MCSFET exceeds the final threshold voltage level. Here, when the gate to source voltage is at such level, the MCSFET is turned on, in that an inversion layer forms in a part of the channel region as a result of the voltage applied between the gate and the source of the MCSFET. The difference is that when the gate to source voltage is above the final threshold voltage and the MCSFET is in the second conductive state, the inversion layer of the MCSFET extends within a larger part of the channel region so as to turn on a larger part of the transistor. Thus, a predetermined part of the MCSFET smaller than the entire MCSFET becomes fully conductive when the gate-source voltage exceeds the first threshold voltage, and a remaining predetermined part of the MCSFET becomes fully conductive when the gate-source voltage exceeds the second or "final" threshold voltage level. In a particular embodiment, the MCSFET is fabricated in such way that the transistor has one threshold voltage for a first part of the width of the transistor channel, and has a higher threshold voltage for the remaining part of the transistor channel width. For example, the transistor can have a gate oxide that varies in thickness between the two parts of the transistor channel width and conditions in which threshold voltage implants are conducted in the two parts of the transistor channel can be varied in order to achieve the desired difference in threshold voltages.

Figure 4:
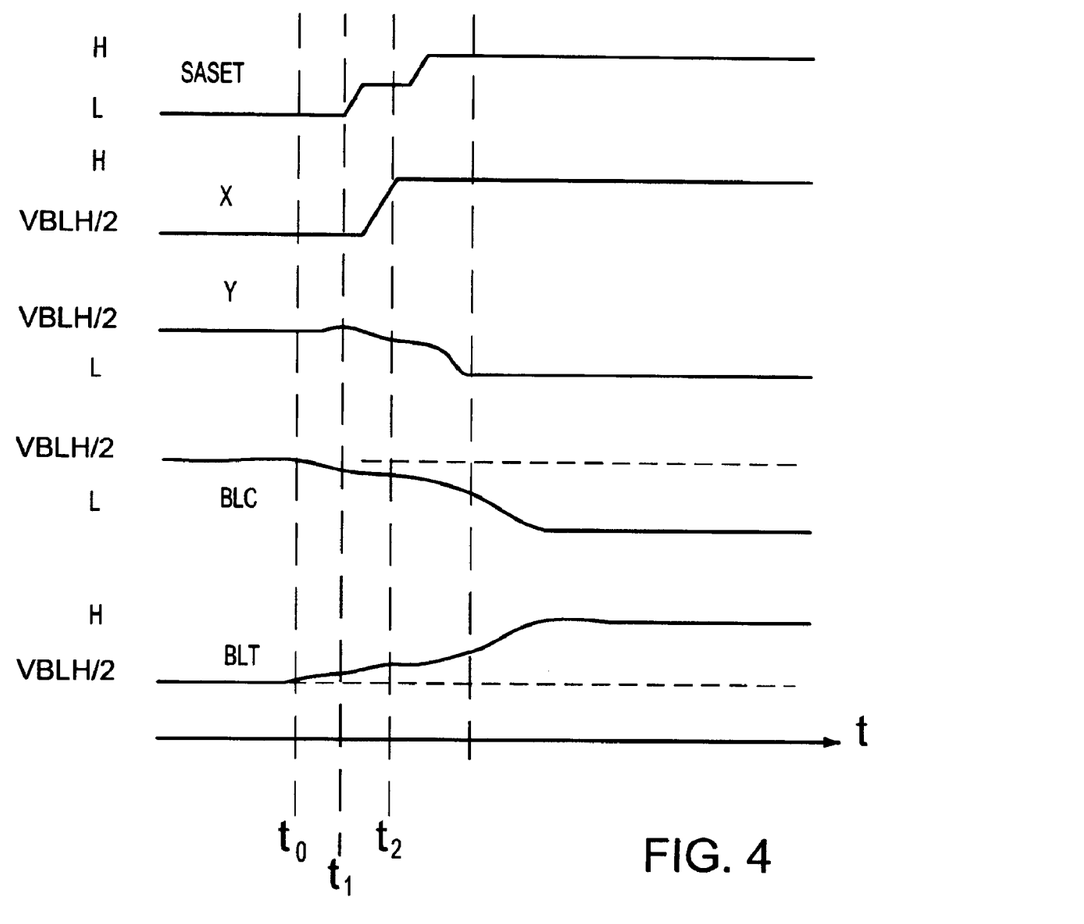
FIG. 4 is a timing diagram illustrating operation of the sensing circuit according to the embodiment of the invention illustrated in FIG. 3.

FIG. 4 is a timing diagram illustrating operation of the sense amplifier in accordance with an embodiment of the invention. FIG. 4 illustrates signal voltage levels on the SASET timing signal, at nodes X and Y, and on the bitlines BLT and BLC with respect to time. As shown in FIG. 4, SASET is not a simple on-off type of signal. Rather, SASET is raised in stair-step fashion in stages from low to high. Initial conditions are represented at time t0. The SASET signal first rises at time t1 from the low rail voltage level, e.g., ground, to an intermediate level to transition the MCSFET N8 from an essentially nonconductive state to the first conductive state. The SASET signal then dwells at the intermediate level for a period of time. Thereafter, at time t2 the SASET signal rises from the intermediate level to the final high rail voltage level in order to operate the MCSFET above the final threshold voltage, i.e., in the high conductive state.

Thus, in the example of operation shown in FIG. 4, the bitlines BLT and BLC are precharged prior to time t0 to a predetermined level, e.g., one half of the bitline high rail voltage, i.e., "Vblh/2". Then, at time t0, the incoming signal is allowed to develop, i.e., the signal levels on the bitlines BLT and BLC will begin to become differentiated. Typically, this will occur when a wordline accesses a memory cell connected to BLT, causing a charge stored in the memory cell or other signal stored in the memory cell to be transferred onto the bitline. Another way the signal can develop is for the transfer devices N3, N4 (FIG. 3) to be turned on by a column select signal CSL during a write operation.

After a predetermined interval has passed, at time t1, the SASET signal transitions to a intermediate voltage level sufficient to turn on the MCSFET N8 at the lower conductive state, but not sufficient to turn it on at the higher conductive state. The SASET signal is applied directly to the MCSFET N8 but is applied through an inverter I1 to the pull-up device P3. As a result, the inverted signal PSETN output from I1 transitions to the high level immediately after SASET transitions to the intermediate level, causing the pull-up device P3 to fully turn on somewhat earlier in the amplification cycle than the pull-down device N8, thus pulling up the voltage level of node X to the high rail voltage level Vblh.

At that time, because the MCSFET is conductive in the lower conductive state, the amount of current that it sinks is much less than the amount it sinks than when its gate to source voltage is raised above the final threshold level. As a result, the voltage at node Y is much slower to be discharged to ground than the voltage at node X is raised to Vblh. Because of this, the signals that develop on BLT and BLC prior to time t1 are amplified gradually, with a somewhat stronger pull-up device P3 which turns on fully and quickly during amplification, and with a pull-down device N8 that acts weakly at first and becomes stronger later at time t2 when SASET is raised to the final high logic level. In such way, signal levels are allowed to develop and become fairly differentiated before they are amplified by the fully turned pull-down device N8 to full rail-to-rail levels on BLT and BLC, respectively.

Figure 5:
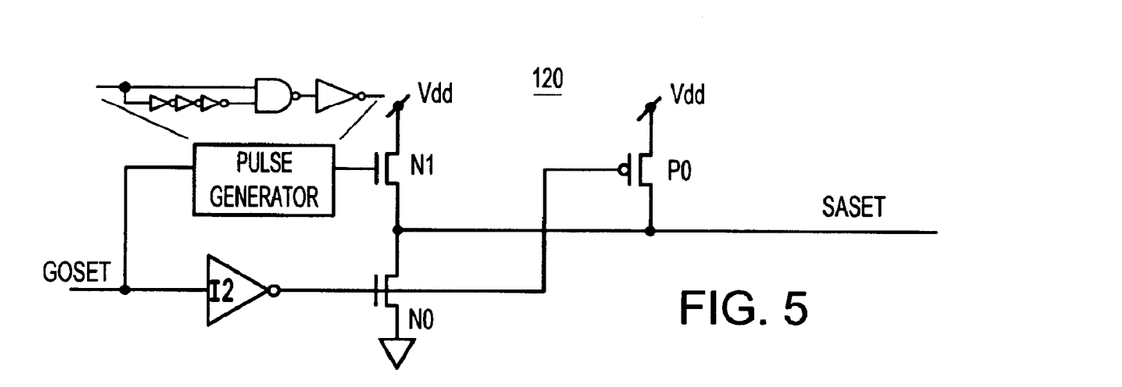
FIG. 5 is a circuit-level schematic diagram illustrating a circuit for generating a sense amplifier set signal ("SASET") for use in the embodiment of the invention illustrated in FIG. 3.

FIG. 5 is a circuit-level schematic diagram illustrating a circuit 120 used to generate the above-described SASET signal. As shown therein, the circuit 120 includes an NFET pull-up device N1, an NFET pull-down device N0, and a PFET pull-up device P0. The circuit 120 further includes a pulse generator and an inverter I2. The pulse generator can be implemented by an inverter delay chain and combinational logic, e.g., a NAND gate followed by an inverter, as shown in FIG. 5. A rail-to-rail trigger signal GOSET is applied to the input of the pulse generator and inverter I2. The output SASET is taken at an intermediate node to which the pull-up devices N2 and P0 and the pull-down device N0 are coupled. In operation, when the GOSET signal is asserted, the pulse generator outputs a pulse to the gate of the pull-up device N1. That device N1 then raises the voltage at the SASET node from ground to an intermediate level voltage. The intermediate level voltage is determined by the difference between the power supply voltage Vdd and the threshold voltage of device N1, thus being Vdd-Vt or about 0.5 V. The GOSET signal also causes the output of the inverter I2 to transition to the low level, which then causes pull-up device P0 to turn on and begin pulling the voltage of the SASET node up to Vdd, but at some time later than the time at which device N1 pulls the voltage up to the intermediate voltage level. Finally, when the GOSET signal transitions to low again and is no longer asserted, the output of inverter I2 transitions to the high level, turning off the pull-up device P0 and causing the device N0 to reset the SASET signal to low.

Figure 6:
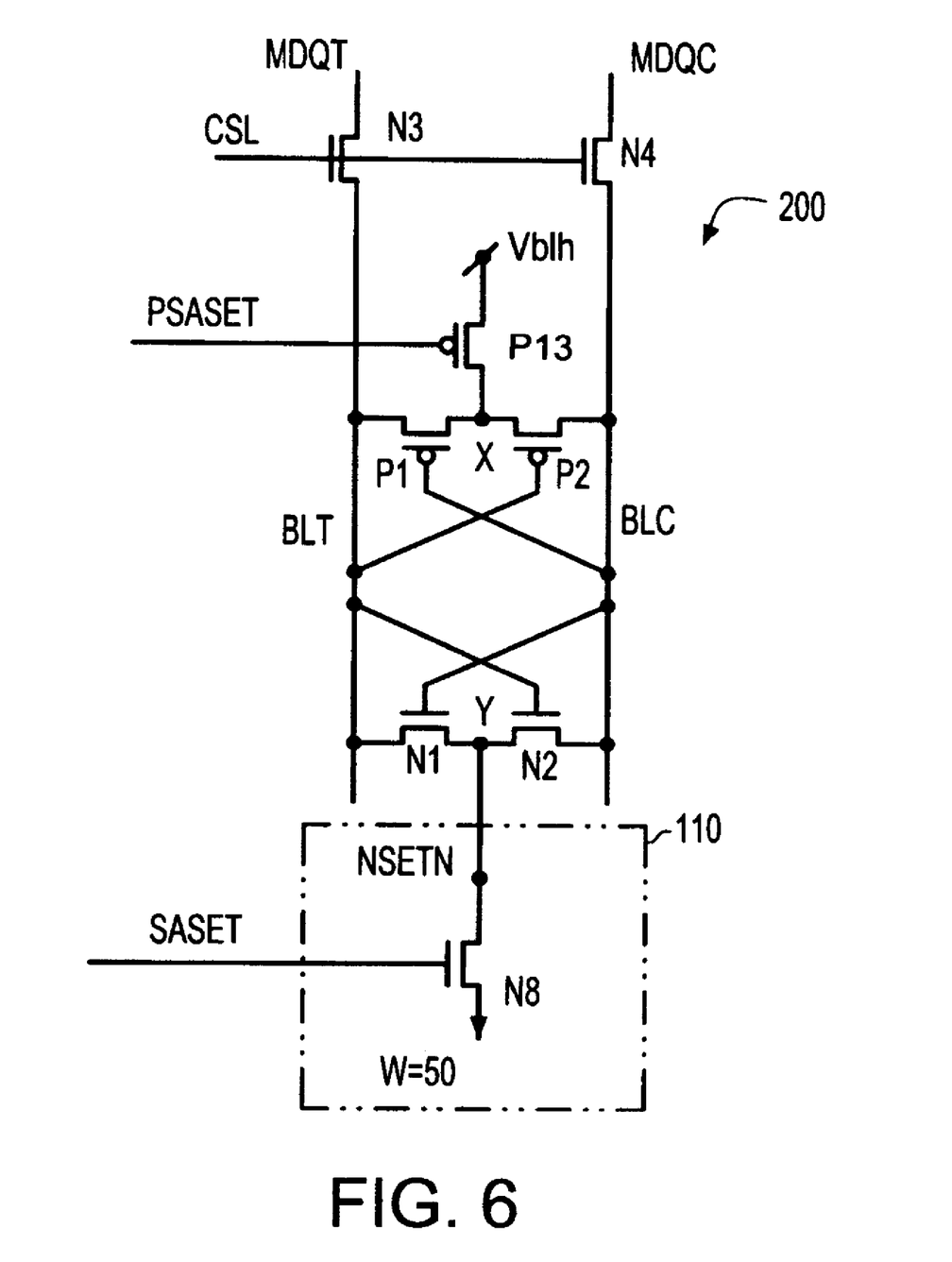
FIG. 6 is a circuit-level schematic diagram illustrating a sensing circuit according to another embodiment of the invention.

In a particular embodiment of the invention shown in FIG. 6, a pull-up device P13 of sense amplifier 200 is implemented by a p-type MCSFET which has a p-type conductivity channel. The p-type MCSFET operates in a manner similar to the n-type MCSFET N8 described above, except that it is a p-type device and is used to pull up the voltage on one of the bitlines BLT and BLC to the high rail voltage level. The p-type MCSFET P13 has a first threshold voltage and conducts in a relatively low conduction state when the voltage between the gate and the source (the "gate to source voltage") exceeds (that is, falls below) the first threshold voltage but does not exceed (that is, fall below) the second threshold voltage. The p-type MCSFET P13 also has a second threshold voltage and conducts in a relatively high conduction state when the gate to source voltage exceeds (that is, falls below) the second threshold voltage.

Like the pull-down MCSFET device N8 described above, the magnitude of the current conducted by the pull-up MCSFET device P13 is modulated over time so that it acts weakly at first, allowing the signals on the bitlines BLT and BLC to develop before fully turning on and driving the signals to their full rail-to-rail levels. The pull-up device P13 is first turned on in the relatively low conduction state by applying an intermediate level negative gate to source voltage to device P13. Later, the pull-up device P13 is fully turned on in the relatively high conduction state by applying a more negative gate to source voltage to device P13.

As shown in FIG. 6, the circuit 200 is modified from that shown in FIG. 3 in that a modified signal PSASET is provided to the gate of the pull-up device P13 for use in place of the signal PSETN used in circuit 100 (FIG. 3). The signal PSASET has a stair-step appearance similar to that of signal SASET supplied to the gate of pull-down device N8 in circuit 100 (FIG. 3) as well as circuit 200 (FIG. 6), except that PSASET starts from a high level and finishes at the low level, the low level being a level which produces a gate to source voltage that exceeds, i.e., falls below the second (lower) threshold voltage of device P13.

In another variation, a p-type MCSFET used as a pull-up device can be provided together with an ordinary function single field effect transistor device as the pull-down device of the sense amplifier. In such case, operation of the pull-up device is as described above, while the pull-down device turns on fully at one time. Here, the signal PSASET is passed through an inverter to obtain a signal for operating the pull-down device. If necessary, the time that the pull-down FET turns on can be delayed somewhat from the time at which the pull-up device is first turned on at the low conductive state. In such case, a delay chain including two or more additional inverters can be used to delay the arrival of the inverted version of PSASET at the gate of the pull-down device. Alternatively, or in addition thereto, the strength of the pull-down device can be adjusted by varying the size of the pull-down device.

In a variation of the above-described embodiments, the sense amplifier is constructed to perform "direct" sensing rather than "complementary" sensing, as shown and described above with respect to all of the foregoing embodiments. In a direct sensing scheme, the voltage on a sensed bitline is pulled down to a low rail voltage level or pulled up to a high rail voltage level according to whichever direction the voltage on the bitline begins to move when the memory cell is accessed, as described in U.S. Pat. No. 6,449,202 to Akatsu, et al., which is hereby incorporated herein by reference. In a direct sensing scheme, one or both of the pull-down devices N8 and P13 are removed. In the place of the pull-down device N8, n-type MCSFETs can be used as pull-down devices having gates coupled to the bitlines BLT and BLC, respectively, sources coupled in conduction paths to ground, and drains coupled in conduction paths to outputs of the sense amplifier, i.e., to respective master data lines. Similarly, p-type MCSFETs can be used as pull-up devices having gates coupled to the bitlines BLT and BLC, respectively, sources coupled in conduction paths to a voltage power supply, and drains coupled in conduction paths to outputs of the sense amplifier, i.e., to respective master data lines. When the direct sensing type sense amplifier includes such MCSFETs, the more gradual turning on of the MCSFETs assists in obtaining better noise immunity as in the above-described embodiments.

While sense amplifiers are utilized in DRAM chips and embedded DRAM macros of particular chips, the use of sense amplifiers is not limited to DRAM. Small voltage swing signals which require amplification to rail-to-rail voltage levels can be present within almost any type of chip. For example, chips found in many types of systems are used to translate analog signals into digital signals, and examples of such analog signals include but are not limited to: environmental measurement signals such as those which measure temperature, pressure, force, or humidity, etc.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. An integrated circuit including a circuit for amplifying a small voltage swing signal into a second signal having a rail-to-rail voltage swing, comprising:
a conductor adapted to conduct a first signal having a small voltage swing and a second signal having a rail-to-rail voltage swing; and
an amplifier coupled to the conductor, said amplifier operable to amplify said first signal into said second signal, said amplifier including a multiple conduction state field effect transistor ("multi-state FET") having a source, a drain, and a gate operable to control conduction between said source and said drain, said multi-state FET having a first threshold voltage and a second threshold voltage effective at the same time as said first threshold voltage, said gate operable to control said multi-state FET between multiple operational states including a) an essentially nonconductive state when a gate-source voltage applied between said gate and said source does not exceed said first threshold voltage and does not exceed said second threshold voltage and in which a source-drain current between said source and said drain is at most negligible; b) a first conductive state when said gate-source voltage exceeds said first threshold voltage and does not exceed said second threshold voltage such that said source-drain current has a first operating value; and c) a second conductive state when said gate-source voltage exceeds said first threshold voltage and said second threshold voltage such that said source-drain current has a second operating value at least about ten times larger than said first operating value; wherein said multi-state FET is operable by said gate-source voltage to switch between said essentially nonconductive state, said first conductive state and said second conductive state to perform an operation included in amplifying said first signal into said second signal by said amplifier.

2. A computing system having a processor and an external input-output interface, said computing system including at least one integrated circuit as claimed in claim 1.

3. An integrated circuit including a sensing circuit, comprising:
a pair of conductors including a first conductor and a second conductor adapted to conduct a first differential signal having a small voltage difference and a second differential signal having a rail-to-rail voltage difference; and
a sense amplifier coupled to said pair of conductors, said sense amplifier operable to amplify said first differential signal into said second differential signal, said sense amplifier including: a multiple conduction state field effect transistor ("multi-state FET") having a source, a drain, and a gate operable to control conduction between said source and said drain, said multi-state FET having a first threshold voltage and a second threshold voltage effective at the same time as said first threshold voltage, said gate operable to control said multi-state FET between multiple operational states including a) an essentially nonconductive state when a gate-source voltage applied between said gate and said source does not exceed said first threshold voltage and does not exceed said second threshold voltage and in which a source-drain current between said source and said drain is at most negligible; b) a first conductive state when said gate-source voltage exceeds said first threshold voltage and does not exceed said second threshold voltage such that said source-drain current has a first operating current value; and c) a second conductive state when said gate-source voltage exceeds said first threshold voltage and said second threshold voltage such that said source-drain current has a second operating current value at least about ten times larger than said first operating current value; wherein said multi-state FET is operable by said gate voltage to switch between said essentially nonconductive state, said first conductive state and said second conductive state to perform an operation included in amplifying said first signal into said second signal by said sense amplifier.

4. The integrated circuit as claimed in claim 3, wherein said sense amplifier includes a first portion operable to at least begin pulling down a voltage level on one of said first and second conductors to a lower rail voltage of said rail-to-rail voltage difference when said multi-state FET is operated in said first conductive state.

5. The integrated circuit as claimed in claim 4, wherein said sense amplifier further includes a second portion operable to pull up a voltage level on another one of said first and second conductors to an upper rail voltage of said rail-to-rail voltage difference when said multi-state FET is operated in said second conductive state.

6. The integrated circuit as claimed in claim 3 wherein said sensing circuit is operable to precharge said pair of conductors to a precharge voltage level and to thereafter permit said first differential signal to develop on said pair of precharged conductors prior to amplifying said first differential signal into said second differential signal.

7. The integrated circuit as claimed in claim 6, wherein said precharge voltage level is selected from an upper rail level of said rail-to-rail voltage difference and a lower rail level of said rail-to-rail voltage difference.

8. The integrated circuit as claimed in claim 6, wherein said precharge voltage level is a predetermined voltage level between said upper rail level and said lower rail level.

9. A computing system having a processor and an external input-output interface, said computing system including at least one integrated circuit as claimed in claim 3.

10. The integrated circuit as claimed in claim 4, wherein said multi-state FET has an n-type conductivity channel, said drain of said multi-state FET is coupled to a first internal node of said sense amplifier and said source of said multi-state FET is coupled to ground such that said operation performed by said multi-state FET includes pulling down a voltage level at said first internal node to ground.

11. The integrated circuit as claimed in claim 3, wherein said first portion of said sense amplifier includes a first n-type field effect transistor ("NFET") having a drain coupled to said first conductor, a source coupled to said first internal node and a gate coupled to said second conductor, and a second NFET having a drain coupled to said second conductor, a source coupled to said first internal node and a gate coupled to said first conductor, and said sense amplifier further includes a second internal node, a first p-type field effect transistor ("PFET") having a drain coupled to said first conductor, a source coupled to said second internal node, and a gate coupled to said second conductor, and a second PFET having a drain coupled to said second conductor, a source coupled to said second internal node, and a gate coupled to said first conductor, said sensing circuit further comprising a p-type field effect transistor ("PFET") having a drain coupled to said second internal node and a source coupled to a voltage supply having an upper rail level of said rail-to-rail voltage difference, wherein one of said first and second NFETs is operable to drive a voltage level on one of said first and second conductors to one of said upper rail level and a lower rail level of said rail-to-rail voltage difference when said multi-state FET is operated in said first conductive state, and one of said first and second PFETs is operable to drive another one of said first and second conductors to another one of said upper rail level and said lower rail level when said multi-state FET is operated in said second conductive state.

12. The integrated circuit as claimed in claim 3, further comprising a dynamic random access memory ("DRAM"), wherein said pair of conductors are operable to conduct said first differential signal when reading out a signal representative of a data bit stored in a memory cell of said DRAM, and to conduct said second differential signal when writing a signal representative of a data bit to said memory cell of said DRAM.

13. A method of amplifying a first signal having a small voltage difference into a second signal having a rail-to-rail voltage difference, comprising:
conducting said first differential signal on a pair of conductors including a first conductor and a second conductor to a sense amplifier; and
varying a gate-source voltage applied between a gate and a source of a multi-state field effect transistor ("multi-state FET") coupled to an internal node of said sense amplifier to perform an operation of said sense amplifier to amplify said first signal into said second signal; and
conducting said second signal on said pair of conductors, wherein said step of varying said gate voltage including switching said multi-state FET between an essentially nonconductive state, a first conductive state and a second conductive state, said essentially nonconductive state being characterized by a magnitude of said gate-source voltage being less than a magnitude of a first threshold voltage of said multi-state FET and less than a magnitude of a second threshold voltage of said multi-state FET and said source-drain current between a source and a drain of said multi-state FET being at most negligible; b) said first conductive state being characterized by said source-drain current having a first operating current value in which said magnitude of said gate-source voltage is greater than said magnitude of said first threshold voltage and less than a magnitude of a second threshold voltage; and c) said third conductive state being characterized by said magnitude of said gate voltage being greater than said magnitude of said second threshold voltage, such that said source-drain current has a second operating current value being at least about ten times higher than said first operating current value.

14. The method as claimed in claim 13, wherein said operation to amplify said first signal into said second signal includes at least beginning to pull down a voltage level on one of said first and second conductors to a lower rail level of said rail-to-rail voltage difference when said multi-state FET is operated in said first conductive state.

15. The method as claimed in claim 14, wherein said operation to amplify said first signal into said second signal includes pulling up a voltage level on another on one of said first and second conductors to an upper rail level of said rail-to-rail voltage difference when said multi-state FET is operated in said second conductive state.

16. The method as claimed in claim 13, further comprising precharging said pair of conductors to a precharge voltage level and thereafter permitting said first differential signal to develop on said pair of precharged conductors prior to said step of varying said gate voltage to perform said operation to amplify said first differential signal into said second differential signal.

17. The method as claimed in claim 16, wherein said precharge voltage level is one of an upper rail level and a lower rail level of said rail-to-rail voltage difference.

18. The method as claimed in claim 16, wherein said precharge voltage level is an intermediate level between an upper rail level and a lower rail level of said rail-to-rail voltage difference.

19. The method as claimed in claim 14, wherein said multi-state FET has an n-type conductivity channel, said drain of said multi-state FET is coupled to a first internal node of said sense amplifier and said source of said multi-state FET is coupled to ground, such that said step of varying said gate-source voltage to perform said operation of said sense amplifier includes discharging a voltage of said first internal node.

20. The method as claimed in claim 13, wherein said pair of conductors are coupled to at least one memory cell of a dynamic random access memory ("DRAM"), said first differential signal is conducted as a signal representative of a data bit read from said at least one memory cell, and said second differential signal is conducted from said sense amplifier to said memory cell when writing a signal representative of a data bit to said memory cell.

* * * * *